United States Patent
Ito et al.

(10) Patent No.: US 12,004,430 B2
(45) Date of Patent: Jun. 4, 2024

(54) PIEZOELECTRIC VALVE AND METHOD OF MANUFACTURING THE PIEZOELECTRIC VALVE

(71) Applicants: SATAKE CORPORATION, Tokyo (JP); MECHANO TRANSFORMER CORPORATION, Tokyo (JP)

(72) Inventors: Takafumi Ito, Tokyo (JP); Tadashi Matsushita, Tokyo (JP); Toshiro Higuchi, Tokyo (JP); Sze Keat Chee, Tokyo (JP); Yoshinobu Mizuno, Ibaraki (JP)

(73) Assignees: SATAKE CORPORATION, Tokyo (JP); MECHANO TRANSFORMER CORPORATION, Tokyo (JP)

( * ) Notice: Subject to any disclaimer, the term of this patent is extended or adjusted under 35 U.S.C. 154(b) by 252 days.

(21) Appl. No.: 17/605,914

(22) PCT Filed: Jan. 22, 2020

(86) PCT No.: PCT/JP2020/002126
§ 371 (c)(1),
(2) Date: Oct. 22, 2021

(87) PCT Pub. No.: WO2020/217610
PCT Pub. Date: Oct. 29, 2020

(65) Prior Publication Data
US 2022/0213973 A1    Jul. 7, 2022

(30) Foreign Application Priority Data

Apr. 23, 2019  (JP) ................................. 2019-082292

(51) Int. Cl.
*H10N 30/88*    (2023.01)
*F16K 31/00*    (2006.01)
(Continued)

(52) U.S. Cl.
CPC ............ *H10N 30/88* (2023.02); *F16K 31/007* (2013.01); *F16K 31/02* (2013.01); *F16K 31/44* (2013.01);
(Continued)

(58) Field of Classification Search
CPC ...... F16K 31/007; F16K 31/004; F16K 31/02; F16K 31/44; H10N 30/50; H10N 30/883;
(Continued)

(56) References Cited

U.S. PATENT DOCUMENTS 4,051,396 A * 9/1977 Berlincourt ............ H02N 2/183
310/339
4,662,212 A * 5/1987 Noguchi .............. G01N 29/024
73/24.01

(Continued)

FOREIGN PATENT DOCUMENTS

CN    101785125 A    7/2010
JP    S63-026476 A    2/1988
(Continued)

OTHER PUBLICATIONS

Extended European Search Report dated Jul. 28, 2023 in Application No. 20794390.3.
(Continued)

*Primary Examiner* — William M McCalister
(74) *Attorney, Agent, or Firm* — Faegre Drinker Biddle & Reath LLP

(57) ABSTRACT

Provided is a piezoelectric valve in which the valve is opened/closed utilizing a displacement of a laminated piezoelectric element, including: a valve main body having a gas pressure chamber that receives compressed gas supplied externally; and an actuator having a valving element, the laminated piezoelectric element that generates a driving force required for operating the valving element as the (Continued)

displacement, and a displacement enlarging mechanism that enlarges the displacement of the laminated piezoelectric element to be acted on the valving element, the actuator being disposed in the valve main body, in which a surface of the laminated piezoelectric element is coated with silicone in a state in which the laminated piezoelectric element is integrated into the actuator.

8 Claims, 6 Drawing Sheets

(51) Int. Cl.
  *F16K 31/02* (2006.01)
  *F16K 31/44* (2006.01)
  *H02N 2/04* (2006.01)
  *H10N 30/20* (2023.01)
  *H10N 30/50* (2023.01)
(52) U.S. Cl.
  CPC .............. *H02N 2/04* (2013.01); *H02N 2/043* (2013.01); *H10N 30/50* (2023.02); *H10N 30/883* (2023.02); *F16K 31/004* (2013.01); *H10N 30/20* (2023.02)
(58) Field of Classification Search
  CPC ........ H10N 30/20; H10N 30/88; H02N 2/043; H02N 2/04
  USPC ..................................... 251/129.06
  See application file for complete search history.

(56) References Cited

U.S. PATENT DOCUMENTS

| | | | | |
|---|---|---|---|---|
| 5,253,010 A * | 10/1993 | Oku | ................... | H01L 23/4985 |
| | | | | 257/E23.125 |
| 5,331,241 A * | 7/1994 | Itoh | ..................... | H10N 30/073 |
| | | | | 310/348 |
| 5,589,723 A * | 12/1996 | Yoshida | ................. | H02N 2/025 |
| | | | | 310/323.02 |
| 5,747,672 A * | 5/1998 | Parent | ................... | G10K 11/004 |
| | | | | 73/61.79 |
| 5,786,654 A * | 7/1998 | Yoshida | ................. | H02N 2/067 |
| | | | | 310/323.17 |
| 5,920,145 A * | 7/1999 | Wu | ....................... | H10N 30/88 |
| | | | | 310/365 |
| 6,040,643 A * | 3/2000 | Bruns | .................... | H02K 99/20 |
| | | | | 310/12.01 |
| 6,211,602 B1 | 4/2001 | Yoshida et al. | | |
| 6,274,967 B1 | 8/2001 | Zumstrull et al. | | |
| 6,919,666 B2 * | 7/2005 | Bartzke | .................. | H02N 2/025 |
| | | | | 310/323.01 |
| 7,078,846 B2 * | 7/2006 | Tsukui | ...................... | G01P 1/08 |
| | | | | 310/317 |
| 2003/0059194 A1 * | 3/2003 | Trzecieski | ........... | G02B 6/4226 |
| | | | | 385/137 |
| 2005/0006982 A1 * | 1/2005 | Williams | ............... | H02N 2/005 |
| | | | | 310/311 |
| 2008/0265806 A1 * | 10/2008 | Tanaka | ................... | H02N 2/025 |
| | | | | 318/116 |
| 2009/0127974 A1 * | 5/2009 | Piotr | ...................... | H02N 2/025 |
| | | | | 310/317 |
| 2013/0220515 A1 | 8/2013 | Setoguchi | | |
| 2014/0339141 A1 | 11/2014 | Ito et al. | | |

FOREIGN PATENT DOCUMENTS

| | | |
|---|---|---|
| JP | H11-74576 A | 3/1999 |
| JP | H11-75382 A | 3/1999 |
| JP | 2000-252534 A | 9/2000 |
| JP | 2010-104039 A | 5/2010 |
| JP | 2013-520157 A | 5/2013 |
| JP | 2013-108568 A | 6/2013 |
| JP | 2013-124695 A | 6/2013 |
| JP | 2016-061412 A | 4/2016 |
| WO | WO-2009/152409 A1 | 12/2009 |
| WO | WO-2011/103328 A2 | 8/2011 |

OTHER PUBLICATIONS

Japanese Notice of Allowance issued in Japanese Application No. 2019-082292 dated Mar. 14, 2023.
First Chinese Office Action issued Jan. 30, 2024 in Application No. 2020800301572.

* cited by examiner

PIEZOELECTRIC VALVE AND METHOD OF MANUFACTURING THE PIEZOELECTRIC VALVE

CROSS-REFERENCE TO RELATED APPLICATIONS

This application is a National Stage of International Application No. PCT/JP2020/002126, filed Jan. 22, 2020, and claims the benefit of Japanese Patent Application No. 2019-082292, filed Apr. 23, 2019, the entire contents of each of with are incorporated herein by reference.

TECHNICAL FIELD

The present disclosure relates to a piezoelectric valve in which the valve is opened/closed utilizing a displacement of a laminated piezoelectric element, and a method of manufacturing the piezoelectric valve.

BACKGROUND ART

A piezoelectric valve is conventionally known in which the valve is opened/closed utilizing a displacement of a laminated piezoelectric element to eject compressed gas (see Patent Literature 1).

The piezoelectric valve described in Patent Literature 1 utilizes properties of the laminated piezoelectric element having excellent high-speed response performance, and includes a displacement enlarging mechanism that enlarges a small displacement of the laminated piezoelectric element based on the principle of leverage.

In the piezoelectric valve, application of a voltage to the laminated piezoelectric element causes a displacement of the laminated piezoelectric element in an extending direction, the displacement is transmitted to a valving element via the displacement enlarging mechanism, and the valving element is immediately moved to open the valve.

Moreover, in the piezoelectric valve, cancellation of voltage application to the laminated piezoelectric element causes a return force associated with return of the laminated piezoelectric element to an original state, the return force is transmitted to the valving element via the displacement enlarging mechanism, and the valving element is immediately brought into contact with a valve seat to close the valve.

The laminated piezoelectric element has excellent features such as low consumption energy associated with the operation, suitability for high-speed operation, and compactness.

However, the laminated piezoelectric element has a piezoelectric ceramic layer, and is thus structurally fragile, which may cause broken pieces to be ejected together with compressed gas when the piezoelectric valve is used.

Moreover, the laminated piezoelectric element is vulnerable to a highly-humid environment. Thus, in a case of using the piezoelectric valve in a highly-humid environment, moisture may enter the laminated piezoelectric element to shorten the life of the piezoelectric valve.

Thus, the inventors of the present invention have proposed coating a surface of the laminated piezoelectric element with a polyolefin-based resin (see Patent Literature 2).

A piezoelectric valve described in Patent Literature 2 utilizes a laminated piezoelectric element coated with a polyolefin-based resin having properties of small Young's modulus and excellent flexibility and having properties of small moisture permeability and excellent water resistance. This prevents broken pieces of the laminated piezoelectric element from being ejected together with compressed gas when using the piezoelectric valve. Moreover, even in a case of usage in a highly-humid environment, moisture will not enter the laminated piezoelectric element to shorten the life.

Ejection of broken pieces of the laminated piezoelectric element is prevented by coating the surface of the laminated piezoelectric element thinly with a polyolefin-based resin. However, in order to prevent reduction in insulation resistance of the laminated piezoelectric element in a high-temperature, highly-humid environment, the surface of the laminated piezoelectric element needs to be coated with a polyolefin-based resin thickly to some extent. In that case, the movement of the laminated piezoelectric element may be interfered with to reduce the stroke or to cause a failure to perform a correct operation.

CITATION LIST

Patent Literature

[Patent Literature 1] Japanese Patent Laid-Open No. 2013-124695
[Patent Literature 2] Japanese Patent Laid-Open No. 2016-61412

SUMMARY OF INVENTION

Technical Problem

Thus, the present disclosure has an object to provide a piezoelectric valve that can prevent broken pieces of a laminated piezoelectric element from being ejected together with compressed gas when in use, can prevent moisture from entering the laminated piezoelectric element to shorten the life even in a case of usage in a highly-humid environment, and can prevent the movement of the laminated piezoelectric element from being interfered with to reduce the stroke or to cause a failure to perform a correct operation, and to provide a method of manufacturing the piezoelectric valve.

Solution to Problem

In order to achieve the above object, the present disclosure is a piezoelectric valve in which the valve is opened/closed utilizing a displacement of a laminated piezoelectric element, including: a valve main body having a gas pressure chamber that receives compressed gas supplied externally; and an actuator having a valving element, the laminated piezoelectric element that generates a driving force required for operating the valving element as the displacement, and a displacement enlarging mechanism that enlarges the displacement of the laminated piezoelectric element to be acted on the valving element, the actuator being disposed in the valve main body, in which a surface of the laminated piezoelectric element is coated with silicone in a state in which the laminated piezoelectric element is integrated into the actuator.

In the present disclosure, preferably, the surface of the laminated piezoelectric element is coated with silicone filled between a pair of projecting pieces positioned on both sides of the laminated piezoelectric element along a longitudinal direction of the laminated piezoelectric element with gaps between the pair of projecting pieces.

In the present disclosure, preferably, the piezoelectric valve further includes a plate disposed in the valve main body, the actuator being fixed to the plate and disposed in the valve main body together with the plate, in which the pair of projecting pieces are provided on a surface of the plate, the pair of projecting pieces being positioned on both the sides of the laminated piezoelectric element along the longitudinal direction of the laminated piezoelectric element with gaps between the pair of projecting pieces when the actuator is fixed to the plate, and the surface of the laminated piezoelectric element is coated with the silicone filled between the pair of projecting pieces in a state in which the actuator is fixed to the plate.

Herein, in the present disclosure, silicone means a low-viscosity silicone rubber, and preferably a silicone rubber having a viscosity of more than or equal to 0.01 Pa·s and less than or equal to 10.0 Pa·s, and more preferably, a silicone rubber having a viscosity of 2.5 Pa·s can be used.

Moreover, considering workability, a one-component room temperature curing silicone rubber is preferably used. For example, a low-viscosity silicone rubber "KE-3475 (product name)" manufactured by Shin-Etsu Chemical Co., Ltd. or the like is preferably used.

In the present disclosure, preferably, the displacement enlarging mechanism is formed of a metallic material, and an interconnection line for supplying power to the laminated piezoelectric element is molded in a plate formed of a resin material, and an electrode of the interconnection line exposed from the plate is coated with an insulation material in a state in which the electrode is connected to a lead line of the laminated piezoelectric element.

In the present disclosure, preferably, the displacement enlarging mechanism is formed of a metallic material, and a lead line of the laminated piezoelectric element is arranged on an insulating film bonded to a surface of the displacement enlarging mechanism.

Moreover, in order to achieve the above object, the present disclosure is a method of manufacturing a piezoelectric valve in which the valve is opened/closed utilizing a displacement of a laminated piezoelectric element, the piezoelectric valve including a valve main body having a gas pressure chamber that receives compressed gas supplied externally, and an actuator having a valving element, the laminated piezoelectric element that generates a driving force required for operating the valving element as the displacement, and a displacement enlarging mechanism that enlarges the displacement of the laminated piezoelectric element to be acted on the valving element, the actuator being disposed in the valve main body. The method includes supplying silicone onto a surface of the laminated piezoelectric element integrated into the actuator to coat the surface of the laminated piezoelectric element with the silicone.

In the present disclosure, preferably, the silicone is supplied onto the surface of the laminated piezoelectric element integrated into the actuator to coat the surface of the laminated piezoelectric element with the silicone filled between a pair of projecting pieces positioned on both sides of the laminated piezoelectric element along a longitudinal direction of the laminated piezoelectric element with gaps between the pair of projecting pieces.

In the present disclosure, preferably, the piezoelectric valve further includes a plate disposed in the valve main body, the actuator being fixed to the plate and disposed in the valve main body together with the plate, the pair of projecting pieces are provided on a surface of the plate, the pair of projecting pieces being positioned on both the sides of the laminated piezoelectric element along the longitudinal direction of the laminated piezoelectric element with gaps between the pair of projecting pieces when the actuator is fixed to the plate, and after the laminated piezoelectric element is integrated into the actuator and the actuator is fixed to the plate, the silicone is supplied onto the surface of the laminated piezoelectric element to coat the surface of the laminated piezoelectric element with the silicone filled between the pair of projecting pieces.

Advantageous Effects of Invention

In the piezoelectric valve of the present disclosure, the surface of the laminated piezoelectric element is coated with silicone having properties excellent in water resistance and water proofness. This can prevent broken pieces of the laminated piezoelectric element from being ejected together with compressed gas when in use, and can prevent moisture from entering the laminated piezoelectric element to shorten the life even in a case of usage in a highly-humid environment.

Moreover, in the piezoelectric valve of the present disclosure, the surface of the laminated piezoelectric element is coated with silicone having properties whose elasticity and compressibility are greater than those of a conventional polyolefin-based resin. This can prevent the movement of the laminated piezoelectric element from being interfered with to reduce the stroke or to cause a failure to perform a correct operation even in a case where the surface of the laminated piezoelectric element is coated with silicone thickly to some extent in order to prevent reduction in insulation resistance of the laminated piezoelectric element in a high-temperature, highly-humid environment.

In the piezoelectric valve of the present disclosure, the entire circumferential surface of the laminated piezoelectric element can be easily coated with silicone since the surface of the laminated piezoelectric element is coated with silicone filled between the pair of projecting pieces positioned on both sides of the laminated piezoelectric element along the longitudinal direction of the laminated piezoelectric element with gaps between the pair of projecting pieces.

In the piezoelectric valve of the present disclosure, the entire circumferential surface of the laminated piezoelectric element can be easily coated with silicone since the piezoelectric valve further includes a plate disposed in the valve main body, the actuator being fixed to the plate and disposed in the valve main body together with the plate, and the pair of projecting pieces are provided on the surface of the plate, the pair of projecting pieces being positioned on both the sides of the laminated piezoelectric element along the longitudinal direction of the laminated piezoelectric element with gaps between the pair of projecting pieces element when the actuator is fixed to the plate, and the surface of the laminated piezoelectric element is coated with the silicone filled between the pair of projecting pieces in a state in which the actuator is fixed to the plate.

In the method of manufacturing a piezoelectric valve of the present disclosure, silicone is supplied onto the surface of the laminated piezoelectric element integrated into the actuator to coat the surface of the laminated piezoelectric element with the silicone. This prevents an assembling failure when integrating the laminated piezoelectric element into the actuator from occurring even in a case where silicone spreads out and adheres to a place other than the surface of the laminated piezoelectric element.

In the method of manufacturing a piezoelectric valve of the present disclosure, the entire circumferential surface of the laminated piezoelectric element can be easily coated with silicone since silicone is supplied onto the surface of the laminated piezoelectric element integrated into the actuator to coat the surface of the laminated piezoelectric element with the silicone filled between the pair of projecting pieces positioned on both the sides of the laminated piezoelectric element along the longitudinal direction of the laminated piezoelectric element with gaps between the pair of projecting pieces.

In the method of manufacturing a piezoelectric valve of the present disclosure, an assembling failure when fixing the actuator into which the laminated piezoelectric element has been integrated to the plate does not occur even in a case where silicone spreads out and adheres to a place other than the surface of the laminated piezoelectric element since the piezoelectric valve further includes a plate disposed in the valve main body, the actuator being fixed to the plate and disposed in the valve main body together with the plate, the pair of projecting pieces are provided on the surface of the plate, the pair of projecting pieces being positioned on both the sides of the laminated piezoelectric element along the longitudinal direction of the laminated piezoelectric element with gaps between the pair of projecting pieces when the actuator is fixed to the plate, and after the laminated piezoelectric element is integrated into the actuator and the actuator is fixed to the plate, the silicone is supplied onto the surface of the laminated piezoelectric element to coat the surface of the laminated piezoelectric element with the silicone filled between the pair of projecting pieces.

Moreover, in the method of manufacturing a piezoelectric valve of the present disclosure, the pair of projecting pieces positioned on both the sides of the laminated piezoelectric element along the longitudinal direction of the laminated piezoelectric element with gaps between the pair of projecting pieces when the actuator is fixed to the plate are provided on the surface of the plate. This enables the entire circumferential surface of the laminated piezoelectric element to be easily coated with silicone filled between the pair of projecting pieces.

DESCRIPTION OF EMBODIMENT

An embodiment of the present disclosure will be described with reference to the drawings.

Figure 1:
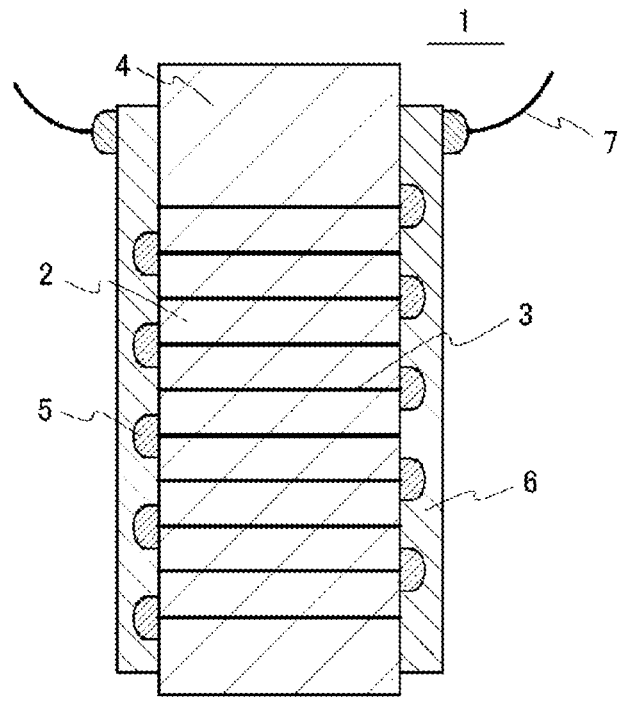
FIG. 1 is a sectional view of a laminated piezoelectric element.

FIG. 1 shows a cross-sectional view of a representative example of a laminated piezoelectric element (hereinafter referred to as a "piezoelectric element").

A piezoelectric element 1 shown in FIG. 1 has a laminate 4 obtained by alternately laminating piezoelectric ceramic layers 2 and inner electrode layers 3. The inner electrode layers 3 are exposed at side surfaces of the laminate 4. The exploded side surfaces of the respective inner electrode layers 3 are coated with an insulation layer 5 in every other layer. The laminate 4 further has an external electrode 6 that covers the insulation layer 5 and conducts with the inner electrode layers 3 that are not coated with the insulation layer 5.

Figure 2:
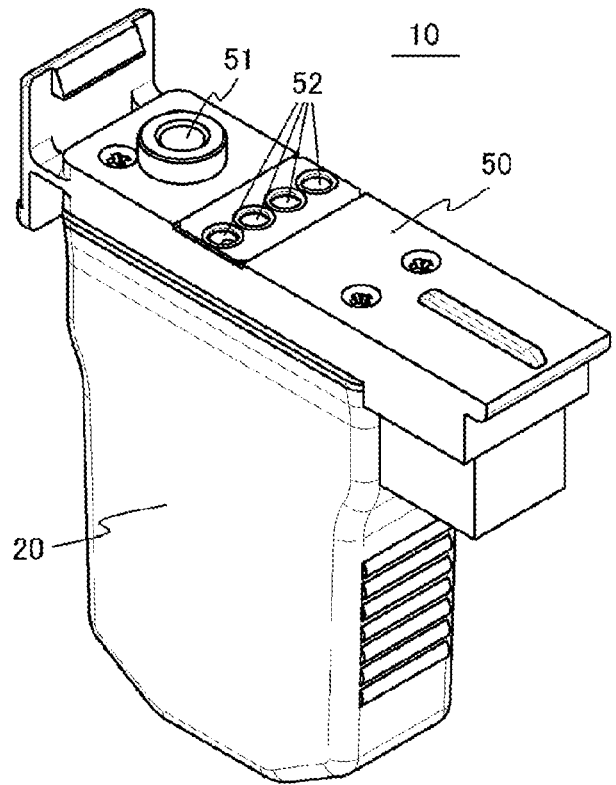
FIG. 2 is a perspective view of a piezoelectric valve.
Figure 3:
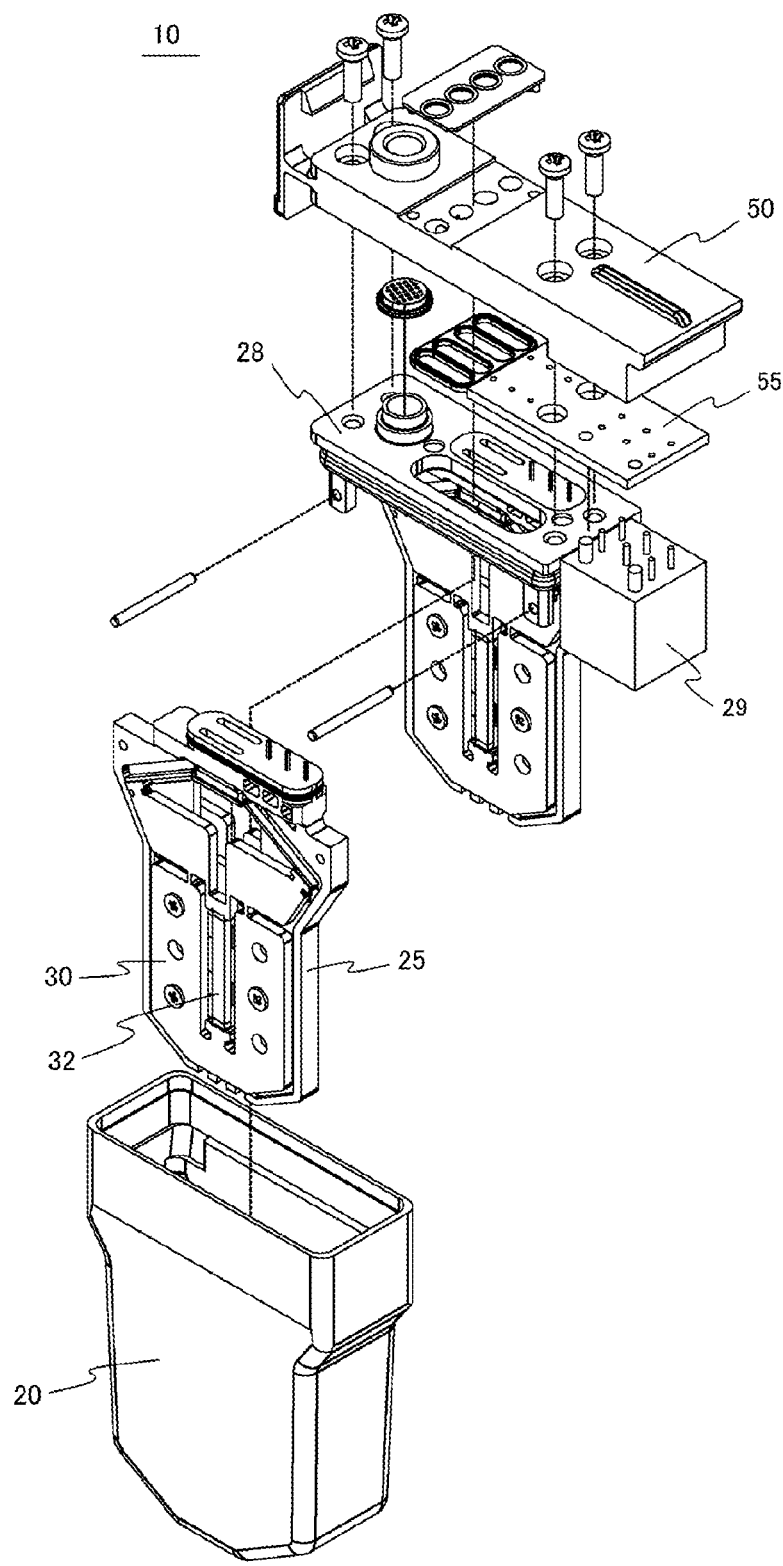
FIG. 3 is an assembly exploded view of the piezoelectric valve.
Figure 4:
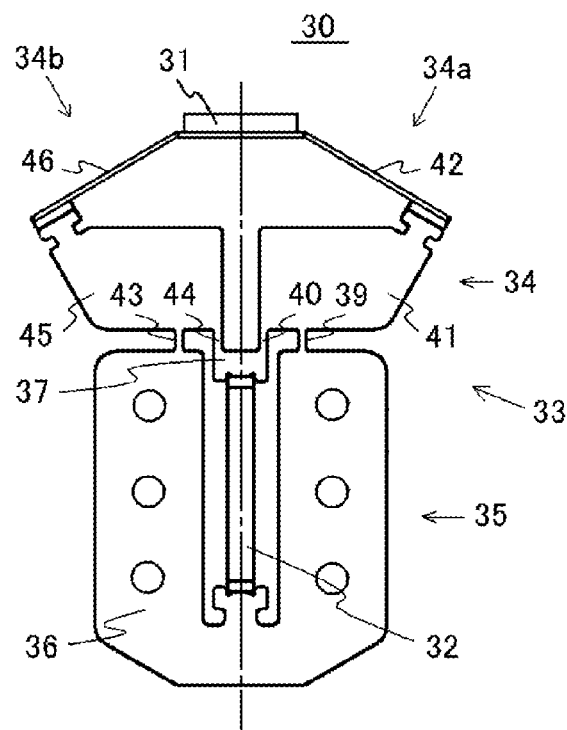
FIG. 4 is an explanatory view of an actuator.
Figure 5:
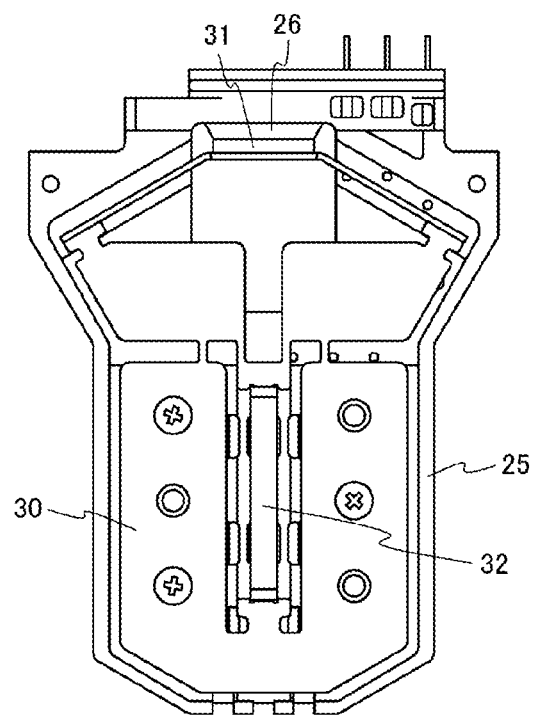
FIG. 5 is an explanatory view in a state in which the actuator is fixed to a valve seat plate.
Figure 6:
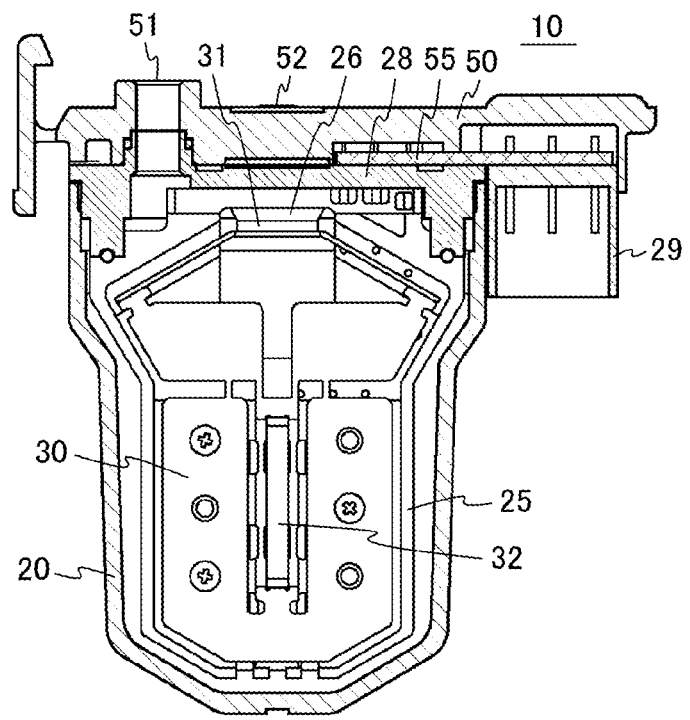
FIG. 6 is a sectional view of the piezoelectric valve, which is an explanatory view in a state in which the valve seat plate is disposed in a valve main body.

FIG. 2 shows a perspective view of an example of a piezoelectric valve. FIG. 3 shows an assembly exploded view of the piezoelectric valve in FIG. 2. FIG. 4 shows an explanatory view of an actuator. FIG. 5 shows an explanatory view in a state in which the actuator is fixed to a valve seat plate. FIG. 6 shows a sectional view of the piezoelectric valve, which is an explanatory view in a state in which the valve seat plate is disposed in a valve main body.

A piezoelectric valve 10 shown in FIG. 2 to FIG. 6 includes a valve main body 20, a valve seat plate 25 disposed in the valve main body 20 and fixed to the valve main body 20, and actuators 30 fixed to both surfaces of the valve seat plate 25 with screws.

The valve main body 20 is a case whose front surface is openable, and includes therein a gas pressure chamber to be supplied with compressed gas from an external compressed gas supply source (not shown).

Moreover, a connector part 50 is provided on the front surface of the valve main body 20. A gas inlet 51 for taking in compressed gas into the valve main body 20 and a gas outlet 52 for discharging compressed gas are open in the front surface of the connector part 50.

An interconnection line substrate 55 for supplying power to the piezoelectric element 32 is disposed between the valve main body 20 and the connector part 50. An interconnection line connector 29 for supplying power to the piezoelectric element 32 via the interconnection line substrate 55 is disposed on one side end of the connector part 50 and at a lateral position of the valve main body 20.

The valve seat plate 25 includes attachment portions for the actuators 30 on both of the surfaces, and has a valve seat 26 with which a valving element 31 which will be described later of the actuator 30 is to be brought into contact. Moreover, a lid member 28 for closing the opening of the case is attached to the front surface of the valve seat plate 25. A gas discharge path that communicates from a valve seat plane of the valve seat 26 to the outlet 52 that is open in the front surface of the connector part 50 is formed in the lid member 28. Furthermore, a gas inlet path that communicates from the inlet 51 that is open in the front surface of the connector part 50 into the valve main body 20 is formed in the lid member 28.

The valve seat plate 25 is molded with a synthetic resin material, for example, and interconnection lines from the interconnection line substrate 55 to the piezoelectric element 32 are molded.

Figure 8:
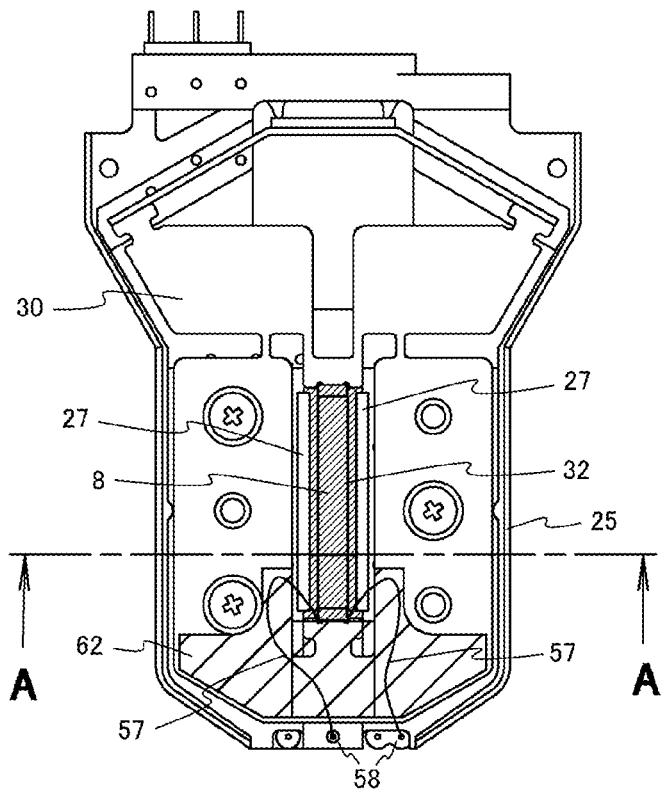
FIG. 8 is a plan view in a state in which the actuator is fixed to a valve seat plate included in the piezoelectric valve according to an embodiment of the present disclosure.

Moreover, electrodes 58 of interconnection lines to be connected to the lead lines 57 of the piezoelectric element 32 as will be described later using FIG. 8 are exposed at a rear position of the valve seat plate 25.

The actuator 30 includes the valving element 31 made of rubber, preferably smooth rubber, a piezoelectric element 32 that generates a driving force required for operating the valving element 31 as a displacement, and a displacement enlarging mechanism 33 that enlarges the displacement of the piezoelectric element 32 to be acted on the valving element 31, as shown in FIG. 4.

The piezoelectric element shown in FIG. 1 can be used for the piezoelectric element 32. Alternatively, a resin-coated piezoelectric element whose entire circumferential surface including the side surfaces at which the inner electrode layers 3 are exposed is coated thinly with epoxy resin can also be used for the piezoelectric element 32.

The displacement enlarging mechanism 33 has a displacement enlarging section 34 that enlarges a displacement of the piezoelectric element 32, and a displacement transmitting section 35 that transmits the displacement of the piezoelectric element 32 to the displacement enlarging section 34. The displacement enlarging mechanism 33 is arranged symmetrically with respect to an axial line in an operating direction of the valving element 31, herein, a straight line (hereinafter referred to as a "center line") connecting the valving element 31 and a longitudinal axial line of the piezoelectric element 32.

The displacement transmitting section 35 has a U-shaped base substrate 36 to which one end of the piezoelectric element 32 is connected, and a cap member 37 to which the other end of the piezoelectric element 32 is connected. Since the piezoelectric element 32 is disposed in a space of the U-shaped base substrate 36, the displacement enlarging mechanism 33 has an arrangement symmetric about the longitudinal axial line of the piezoelectric element 32.

Herein, the piezoelectric element 32 is incorporated into the space of the U-shaped base substrate 36 and between the bottom of the U-shaped base substrate 36 and the cap member 37. By plastically deforming the bottom of the U-shape base substrate 36, the piezoelectric element 32 has one end joined to the bottom of the U-shape base substrate 36 and the other end joined to the cap member 37.

The displacement enlarging section 34 is composed of first and second displacement enlarging sections 34a, 34b arranged symmetrically with respect to the center line.

The first displacement enlarging section 34a has first and second hinges 39, 40, a first arm 41, and a first plate spring 42. One end of the first hinge 39 is integrated with one side leading end of the U-shaped base substrate 36, and one end of the second hinge 40 is integrated with the cap member 37. One end of the first plate spring 42 is joined to an outer leading end portion of the first arm 41, and one side end portion of the valving element 31 is joined to the other end of the first plate spring 42.

On the other hand, the second displacement enlarging section 34b has third and fourth hinges 43, 44, a second arm 45, and a second plate spring 46. One end of the third hinge 43 is integrated with the other-side leading end of the U-shaped base substrate 36, and one end of the fourth hinge 44 is integrated with the cap member 37. One end of the second plate spring 46 is joined to an outer leading end portion of the second arm 45, and the other side end portion of the valving element 31 is joined to the other end of the second plate spring 46.

Herein, the displacement enlarging mechanism 33 can be formed integrally by punching a metallic material such as a stainless material including an invar material, for example.

In the above-described actuator 30, the piezoelectric element 32 is elongated when applying a current to the piezoelectric element 32 in a valve-closed state. A displacement associated with the elongation of the piezoelectric element 32 is enlarged in accordance with the principle of leverage in the displacement enlarging mechanism 33 using the first and third hinges 39, 43 as a fulcrum, the second and fourth hinges 40, 44 as a point of effort, and the outer leading end portions of the first and second arms 41, 45 as a point of load to greatly displace the outer leading end portions of the first and second arms 41, 45.

Then, the displacement of the outer leading end portions of the first and second arms 41, 45 moves the valving element 31 away from the valve seat 26 via the first and second plate springs 42, 46 to open the gas discharge path.

On the other hand, when current application to the piezoelectric element 32 is stopped in the above-described actuator 30, the piezoelectric element 32 contracts, and the contraction causes the valving element 31 to be seated on the valve seat 26 via the displacement enlarging mechanism 33 to close the gas discharge path.

Figure 7:
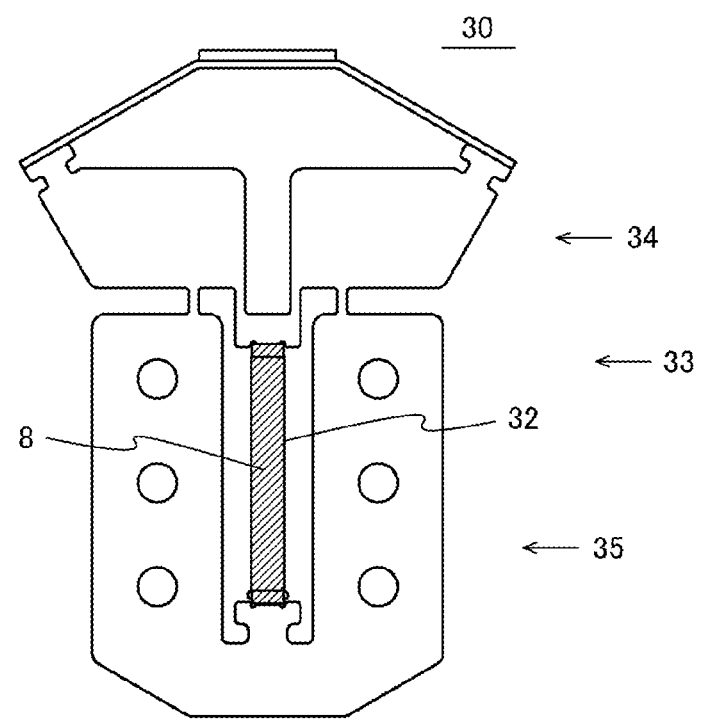
FIG. 7 is a plan view of an actuator included in a piezoelectric valve according to an embodiment of the present disclosure.

FIG. 7 shows a plan view of the actuator included in the piezoelectric valve according to an embodiment of the present disclosure.

In the actuator shown in FIG. 7, the surface of the piezoelectric element 32, that is, at least the side surfaces of the piezoelectric element 32 at which the inner electrode layers are exposed are coated with a silicone 8 in a state in which the piezoelectric element 32 is integrated.

In the piezoelectric valve according to an embodiment of the present disclosure, for example, a piezoelectric element 32 of the type shown in FIG. 1 whose surface is coated with the silicone 8 can be integrally incorporated into the actuator 30.

Moreover, in the piezoelectric valve according to an embodiment of the present disclosure, the silicone 8 can also be supplied onto the surface of the piezoelectric element 32 in the state in which the piezoelectric element 32 is integrated into the actuator 30 with a dispenser, brush, or the like to coat the surface of the piezoelectric element 32 with the silicone 8.

The piezoelectric valve according to an embodiment of the present disclosure eliminates the concern of an occurrence of assembling failure when integrating the piezoelectric element 32 into the actuator 30 even in a case where the silicone 8 spreads out and adheres to a place other than the surface of the piezoelectric element 32 since the silicone 8 is supplied onto the surface of the piezoelectric element 32 in the state in which the piezoelectric element 32 is integrated into the actuator 30 to coat the surface of the piezoelectric element 32 with the silicone 8.

The surface of the piezoelectric element 32 is coated with the silicone 8 in the state in which the piezoelectric element 32 is integrated into the actuator 30, and the piezoelectric valve according to an embodiment of the present disclosure can be assembled by fixing the actuator 30 to the valve seat plate.

Herein, it is sufficient that at least the side surfaces of the piezoelectric element 32 at which the inner electrode layers are exposed be coated with the silicone 8, and preferably, it is sufficient that all the side surfaces (the entire circumferential surface) including the side surfaces at which the inner electrode layers are exposed be coated with the silicone 8.

Moreover, in a case of using a resin-coated piezoelectric element whose entire circumferential surface is coated thinly with epoxy resin for the piezoelectric element 32, it is preferable to coat the entire circumferential surface with the silicone 8.

Figure 9:
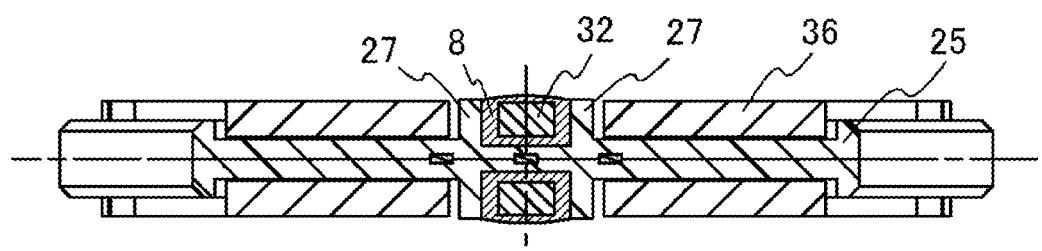
FIG. 9 is a cross-sectional view taken along A-A in FIG. 8.

FIG. 8 shows a plan view in a state in which the actuator is fixed to the valve seat plate included in the piezoelectric valve according to an embodiment of the present disclosure. FIG. 9 shows a cross-sectional view taken along A-A in FIG. 8.

In the piezoelectric valve according to an embodiment of the present disclosure, a pair of projecting pieces 27 are provided at attachment portions of the actuator 30 on the surface of the valve seat plate 25. The pair of projecting pieces 27 are positioned between the piezoelectric element 32 and the displacement transmitting section 35 and on both sides along the longitudinal direction (elongating/contracting direction) of the piezoelectric element 32 with gaps between the pair of projecting pieces 27 when the actuator 30 is fixed with screws.

Moreover, as shown in FIG. 9, the pair of projecting pieces 27 are formed to be higher than the height of the surface of the piezoelectric element 32 of the actuator 30 fixed to the valve seat plate 25.

The piezoelectric valve according to an embodiment of the present disclosure is the actuator 30 shown in FIG. 7, and the entire circumferential surface of the piezoelectric element 32 can be coated with the silicone 8 filled between the pair of projecting pieces 27 by supplying the silicone 8 onto the surface of the piezoelectric element 32 after fixing the piezoelectric element 32 whose side surfaces at which the inner electrode layers are exposed have been coated with the silicone 8 to the valve seat plate 25.

Moreover, in the piezoelectric valve according to an embodiment of the present disclosure, the entire circumferential surface of the piezoelectric element 32 can also be coated with the silicone 8 filled between the pair of projecting pieces 27 by integrating the piezoelectric element 32 whose surface has not been coated with the silicone 8 into the actuator 30, fixing the actuator 30 to the valve seat plate 25, and then supplying the silicone 8 onto the surface of the piezoelectric element 32.

In the piezoelectric valve according to an embodiment of the present disclosure, the pair of projecting pieces 27 positioned on both the sides of the piezoelectric element 32 along the longitudinal direction of the piezoelectric element 32 with gaps between the pair of projecting pieces 27 when the actuator 30 is fixed to the valve seat plate 25 are provided on the surface of the valve seat plate 25. This enables the entire circumferential surface to be easily coated with the silicone 8 filled between the pair of projecting pieces 27.

Note that the piezoelectric valve according to an embodiment of the present disclosure eliminates the concern of an occurrence of an assembling failure when fixing the actuator 32 to the valve seat plate 25 even in a case where the silicone 8 spreads out and adheres to a place other than the surface of the piezoelectric element 32 by integrating the piezoelectric element 32 whose surface has not been coated with the silicone 8 into the actuator 30, fixing the actuator 30 to the valve seat plate 25, and then supplying the silicone 8 onto the surface of the piezoelectric element 32 to coat the entire circumferential surface of the piezoelectric element 32 with the silicone 8 filled between the pair of projecting pieces 27.

Herein, in the present disclosure, the silicone 8 indicates a low-viscosity silicone rubber, and preferably a silicone rubber having a viscosity of more than or equal to 0.01 Pa·s and less than or equal to 10.0 Pa·s, and more preferably, a silicone rubber having a viscosity of 2.5 Pa·s can be used.

Moreover, considering workability, a one-component room temperature curing silicone rubber is preferably used, and for example, a low-viscosity silicone rubber "KE-3475 (product name)" manufactured by Shin-Etsu Chemical Co., Ltd. or the like is preferably used.

In FIG. 8, the electrodes 58 of interconnection lines molded for supplying power to the piezoelectric element 32 are exposed at a rear position of the valve seat plate 25, and are connected to the lead lines 57 of the piezoelectric element 32 by soldering. The electrodes 58 of the interconnection lines are coated with an insulation material not shown in a state in which the electrodes 58 is connected to the lead lines 57. An insulation resin material such as silicone, for example, can be used as the insulation material.

Moreover, as shown in FIG. 8, the actuator 30 has an insulating film 62 bonded at a rear position on the surface of the displacement transmitting section 35 in the displacement enlarging mechanism 33.

In FIG. 8, the interconnection lines from the interconnection line substrate 55 to the piezoelectric element 32 are molded in the valve seat plate 25 to which the actuator 30 is attached. The lead lines 57 of the piezoelectric element 32 are arranged on the insulating film 62 so as to be prevented from being in contact with the metallic material constituting the displacement enlarging mechanism 33 of the actuator 30. The lead lines 57 of the piezoelectric element 32 are connected, by soldering, to the electrodes 58 of the interconnection lines exposed at the rear position of the valve seat plate 25.

Herein, a low moisture-permeable film, for example, can be used as the insulating film 62.

In the present disclosure, the low moisture-permeable film refers to a resin film made of a material having a moisture permeability of less than or equal to 0.5 g/m²·24 hr in 1-mm thickness in an environment at a temperature of 40° C. and a relative humidity of 95%.

A resin film made of a low moisture-permeable material such as, for example, a polyolefin-based resin film of polyethylene, polypropylene, polyethylene terephthalate, or the like can be used as the low moisture-permeable film. Alternatively, a resin film subjected to moisture permeability reducing treatment such as being coated with a moisture permeability reducing agent such as fluorine can also be used as the low moisture-permeable film.

The piezoelectric valve according to an embodiment of the present disclosure described above is provided with the pair of projecting pieces 27 on the surface of the valve seat plate 25. In a case of directly attaching the actuator 20 to the valve main body 20, a pair of projecting pieces can also be provided on an inner wall surface of the valve main body. In that case, by fixing the actuator to the valve main body, and then supplying the silicone 8 onto the surface of the piezoelectric element, the entire circumferential surface of the piezoelectric element 32 can be coated with the silicone 8 filled between the pair of projecting pieces 27.

In the piezoelectric valve of the present disclosure, the surface of the piezoelectric element is coated with silicone having properties excellent in water resistance and water proofness. This can prevent broken pieces of the piezoelectric element from being ejected together with compressed gas when in use, and can prevent moisture from entering the piezoelectric element to shorten the life even in a case of usage in a highly-humid environment.

Moreover, in the piezoelectric valve of the present disclosure, the surface of the piezoelectric element is coated with silicone having properties whose elasticity and compressibility are greater than those of a conventional polyolefin-based resin. This can prevent the movement of the piezoelectric element from being interfered with to reduce the stroke or to cause a failure to perform a correct operation even in a case of coating the surface of the piezoelectric element with silicone thickly to some extent in order to prevent reduction in insulation resistance of the piezoelectric element in a high-temperature, highly-humid environment.

Figure 10:
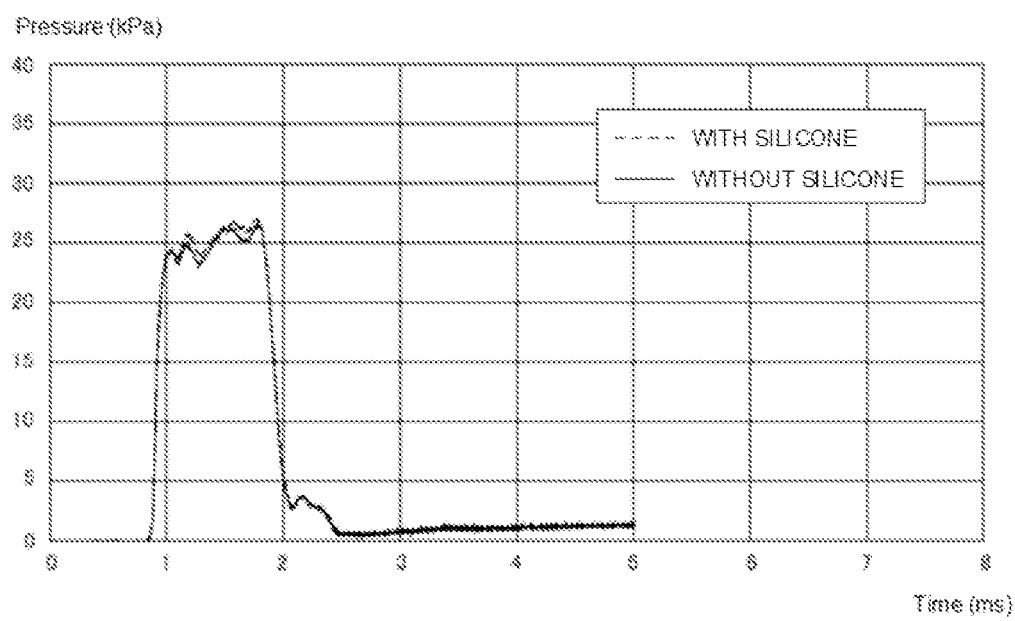
FIG. 10 is a graph showing an ejection pressure property of air ejected from the piezoelectric valve according to an embodiment of the present disclosure.

FIG. 10 shows a graph indicating an ejection pressure property of air ejected from the piezoelectric valve, which is a graph in which a case where the surface of the piezoelectric element is coated with silicone and a case where the surface of the piezoelectric element is not coated with silicone are compared. Note that a coating thickness in the case where the surface of the piezoelectric element is coated with silicone is about 150 µm, and reduction in insulation resistance in a high-temperature, highly-humid environment can be prevented.

Experiments were conducted based on the method described in [Example] in Japanese Patent Laid-Open No. 2017-160973. Experimental conditions were as follows:

(1) Supply pressure of compressed air: 0.15 MPa (a gauge pressure value at an atmospheric pressure)

(2) Driving voltage: 72V (3) Set flow rate of compressed air: 39 L/min (4) Input signal: first pre-pulse time t1=0.098 ms First down-time t2=0.08 ms Second pre-pulse time t3=0.6 ms Second down-time t4=0.03 ms Main pulse time t5=0.192 ms (Energizing time of piezoelectric element: 1 ms)

(5) Detection position of air ejection pressure: 2 mm from leading end of gas discharge path In FIG. 10, the broken line indicates a result of a piezoelectric valve in which the surface of the piezoelectric element is coated with silicone. Moreover, the solid line indicates a result of a piezoelectric valve in which the surface of the piezoelectric element is not coated with silicone.

Comparing them, they substantially agree in air ejection pressure property, and in the piezoelectric valve according to an embodiment of the present disclosure, it was confirmed that the movement of the piezoelectric element was not interfered with even in a case of coating the surface of the piezoelectric element with silicone thickly to some extent in order to prevent reduction in insulation resistance of the piezoelectric element in a high-temperature, highly-humid environment.

The present disclosure is not limited to the above-described embodiment, and can obviously be modified as appropriate in configuration within the range of the disclosure.

INDUSTRIAL APPLICABILITY

The piezoelectric valve of the present disclosure is extremely useful since it is possible to prevent broken pieces of the laminated piezoelectric element from being ejected together with compressed gas when in use, prevent moisture from entering the laminated piezoelectric element to shorten the life even in a case of usage in a highly-humid environment, and prevent the movement of the laminated piezoelectric element from being interfered with to reduce the stroke or to cause a failure to perform a correct operation.

REFERENCE SIGNS LIST 1 laminated piezoelectric element
2 ceramic layer
3 inner electrode layer
4 laminate
5 insulation layer
6 external electrode
7 lead line
8 silicone
10 piezoelectric valve
20 valve main body
25 valve seat plate
26 valve seat
27 projecting piece
28 lid member
29 interconnection line connector
30 actuator
31 valving element
32 laminated piezoelectric element
33 displacement enlarging mechanism
34 displacement enlarging section
35 displacement transmitting section
36 base substrate
37 cap member
39 first hinge
40 second hinge
41 first arm
42 first plate spring
43 third hinge
44 fourth hinge
45 second arm
46 second plate spring
50 connector part
51 gas inlet
52 gas outlet
55 interconnection line substrate
57 lead line
58 electrode
62 insulating film

The invention claimed is:

1. A piezoelectric valve in which the valve is opened/closed utilizing a displacement of a laminated piezoelectric element, comprising:
a valve main body having a gas pressure chamber that receives compressed gas supplied externally; and
an actuator having a valving element, the laminated piezoelectric element that generates a driving force required for operating the valving element as the displacement, and a displacement enlarging mechanism that enlarges the displacement of the laminated piezoelectric element to be acted on the valving element, the actuator being disposed in the valve main body, wherein
a surface of the laminated piezoelectric element is coated with silicone in a state in which after the laminated piezoelectric element is integrated into the actuator, and
a pair of projecting pieces being positioned between the laminated piezoelectric element and the displacement enlarging mechanism and on both sides along a longitudinal direction of the laminated piezoelectric element, gaps being formed between the pair of projecting pieces and the laminated piezoelectric element.

2. The piezoelectric valve according to claim 1, wherein after the laminated piezoelectric element is integrated into the actuator, the gaps between the pair of projecting pieces and the laminated piezo electric element are filled with silicone.

3. The piezoelectric valve according to claim 2, further comprising a plate disposed in the valve main body, the actuator being fixed to the plate and disposed in the valve main body together with the plate, wherein
the pair of projecting pieces are provided on a surface of the plate, the pair of projecting pieces being positioned on both the sides of the laminated piezoelectric element along the longitudinal direction of the laminated piezoelectric element with the gaps between the pair of projecting pieces and the laminated piezo electric element when the actuator is fixed to the plate, and the surface of the laminated piezoelectric element is coated with the silicone filled between the pair of projecting pieces after the actuator is fixed to the plate.

4. The piezoelectric valve according to claim 3, wherein the displacement enlarging mechanism is formed of a metallic material, and an interconnection line for supplying power to the laminated piezoelectric element is molded in the plate, and an electrode of the interconnection line exposed from the plate is coated with an insulation material in a state in which the electrode is connected to a lead line of the laminated piezoelectric element.

5. The piezoelectric valve according to claim 1, wherein the displacement enlarging mechanism is formed of a metallic material, and a lead line of the laminated piezoelectric element is arranged on an insulating film bonded to a surface of the displacement enlarging mechanism.

6. A method of manufacturing a piezoelectric valve in which the valve is opened/closed utilizing a displacement of a laminated piezoelectric element, comprising:

providing a piezoelectric valve, the piezoelectric valve comprising:

a valve main body having a gas pressure chamber that receives compressed gas supplied externally, an actuator having a valving element, the laminated piezoelectric element that generates a driving force required for operating the valving element as the displacement, and a displacement enlarging mechanism that enlarges the displacement of the laminated piezoelectric element to be acted on the valving element, the actuator being disposed in the valve main body, and a pair of projecting pieces being positioned between the laminated piezoelectric element and the displacement enlarging mechanism and on both sides along a longitudinal direction of the laminated piezoelectric element, gaps being formed between the pair of projecting pieces and the laminated piezoelectric element; and supplying silicone onto a surface of the laminated piezoelectric element after being integrated into the actuator to coat the surface of the laminated piezoelectric element with the silicone.

7. The method of manufacturing a piezoelectric valve according to claim 6, wherein the silicone is supplied onto the surface of the laminated piezoelectric element integrated into the actuator to coat the surface of the laminated piezoelectric element with the silicone filled in the gaps between the pair of projecting pieces and the laminated piezoelectric element.

8. The method of manufacturing a piezoelectric valve according to claim 7, wherein the piezoelectric valve further includes a plate disposed in the valve main body, the actuator being fixed to the plate and disposed in the valve main body together with the plate, the pair of projecting pieces are provided on a surface of the plate, the pair of projecting pieces being positioned on both the sides of the laminated piezoelectric element along the longitudinal direction of the laminated piezoelectric element with the gaps between the pair of projecting pieces and the laminated piezo electric element when the actuator is fixed to the plate, and after the laminated piezoelectric element is integrated into the actuator and the actuator is fixed to the plate, the silicone is supplied onto the surface of the laminated piezoelectric element to coat the surface of the laminated piezoelectric element with the silicone filled between the pair of projecting pieces and the laminated piezo electric element.

* * * * *